Feb. 1, 1966 | E. T. PLATZ | 3,233,063

MULTI-POLE CIRCUIT BREAKER

Filed June 5, 1963 | 9 Sheets-Sheet 1

INVENTOR.
ELWOOD T. PLATZ

BY

OSTROLENK, FABER, GERB & SOFFEN
ATTORNEYS

INVENTOR.
ELWOOD T. PLATZ
BY
OSTROLENK, FABER, GERB & SOFFEN
ATTORNEYS

Feb. 1, 1966 E. T. PLATZ 3,233,063

MULTI-POLE CIRCUIT BREAKER

Filed June 5, 1963 9 Sheets-Sheet 4

INVENTOR.
ELWOOD T. PLATZ

BY

OSTROLENK, FABER, GERB & SOFFEN
ATTORNEYS

INVENTOR.
ELWOOD T. PLATZ
BY
OSTROLENK, FABER, GERB & SOFFEN
ATTORNEYS

INVENTOR.
ELWOOD T. PLATZ

BY

OSTROLENK, FABER, GERB & SOFFEN
ATTORNEYS

MULTI-POLE CIRCUIT BREAKER

Filed June 5, 1963 9 Sheets-Sheet 9

INVENTOR.
ELWOOD T. PLATZ
BY
OSTROLENK, FABER, GERB & SOFFEN
ATTORNEYS

④ United States Patent Office 3,233,063
Patented Feb. 1, 1966

1

3,233,063
MULTI-POLE CIRCUIT BREAKER

Elwood T. Platz, Grosse Pointe Farms, Mich., assignor to I-T-E Circuit Breaker Company, Philadelphia, Pa., a corporation of Pennsylvania Filed June 5, 1963, Ser. No. 285,681
19 Claims. (Cl. 200—88)

This invention relates to multiphase circuit breakers in general and more particularly to a construction in which all of the line and load terminals of the circuit breaker are carried by a housing wall which is opposite the housing wall having means for mechanically mounting the breaker.

The R. W. Thomas U.S. Patent 2,938,983, issued May 31, 1960, entitled Circuit Breaker Latch, discloses a single phase circuit breaker in which the line and load terminals extend from the same wall of the breaker with this wall being opposite the wall having mechanical mounting means. Heretofore, circuit breakers of this type have been limited to single phase units or at most to single phase units with their operating handles tied together. However, with the latter arrangement the tripping of one circuit breaker did not cause the other circuit breaker to trip. This arrangement has proven satisfactory for single phase three wire panelboards.

For three phase panelboards of the type illustrated in the Herman et al. pending U.S. application, Serial No. 285,680 filed June 5, 1963, now Patent No. 3,187,228 entitled Sequenced Phase Panelboard, assigned to the assignee of the instant invention it is advantageous to have a multiphase circuit breaker with all line and load terminals projecting from the same side of the breaker with this side being opposite the side having means for mechanically mounting the breaker. The circuit breaker construction should be such that the occurrence of a fault condition in any pole will bring about tripping of all poles. The instant invention provides such a circuit breaker.

In carrying out this purpose the instant invention provides a circuit breaker in which there is a single mechanism for operating the movable contacts into engagement with the stationary contacts. Individual automatic trip units are provided for each phase and individual operating springs are provided to urge the movable contacts into engagement with the stationary contacts. Upon tripping or manual opening of the breaker, these springs bring about separation of the contacts.

Accordingly, a primary object of this invention is to provide a novel construction for a multiphase circuit breaker.

Another object is to provide a multiphase circuit breaker in which there is a mechanical mounting means carried by one housing surface and another housing surface opposite the previously mentioned surface which carries all of the circuit breaker line and load terminals.

Still another object is to provide a circuit breaker of this type in which successive operation of a single handle in the same direction brings about opening and closing of the circuit breaker contacts.

A further object is to provide a circuit breaker of this type which is no wider than the width of three single phase units and may be mounted indiscriminately in a multiphase sequenced panelboard in which the circuit breaker locating means defines locations for single pole circuit breakers.

A still further object is to provide a circuit breaker of this type in which manual operation is effected by rotating a common trip bar.

Yet another object is to provide a novel multiphase circuit breaker which is trip free, yet does not require more than a single stroke for operation from trip to on position.

2

These as well as further objects of this invention shall become readily apparent after reading the following description of the accompanying drawings in which:

FIGURE 9 is a view similar to FIGURES 4 and 6 with the manual operating handle depressed for turning the circuit breaker ON.

In the following a multiphase circuit breaker will be described. In the plan views like elements of different phases are distinguished by the reference numeral letter suffix. However, in the side cross-sections these letter suffixes are omitted.

Figure 1:
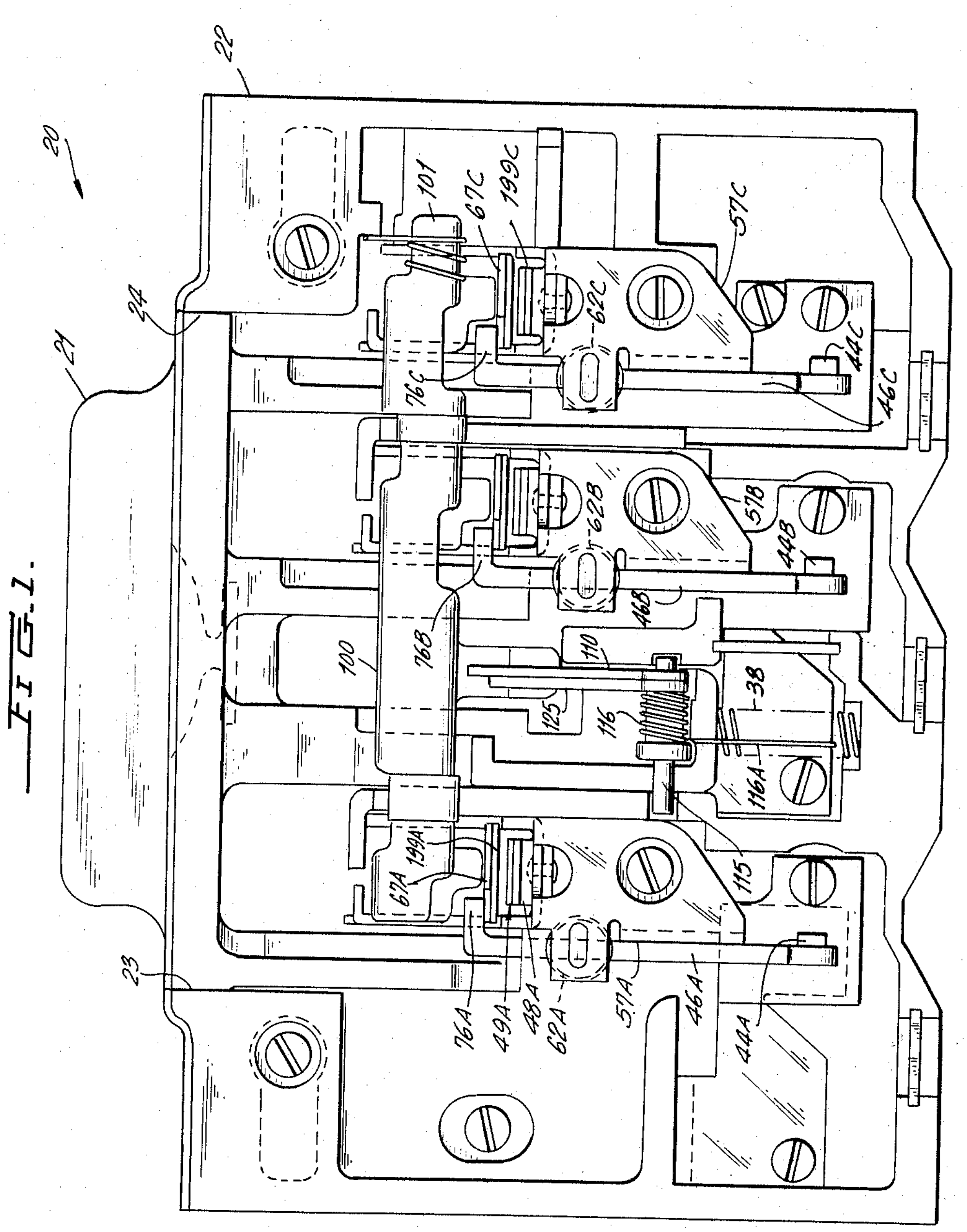
FIGURE 1 is an enlarged rear elevation of a three phase circuit breaker constructed in accordance with the teachings of the instant invention with the front cover removed to reveal the internal elements.
Figure 2:
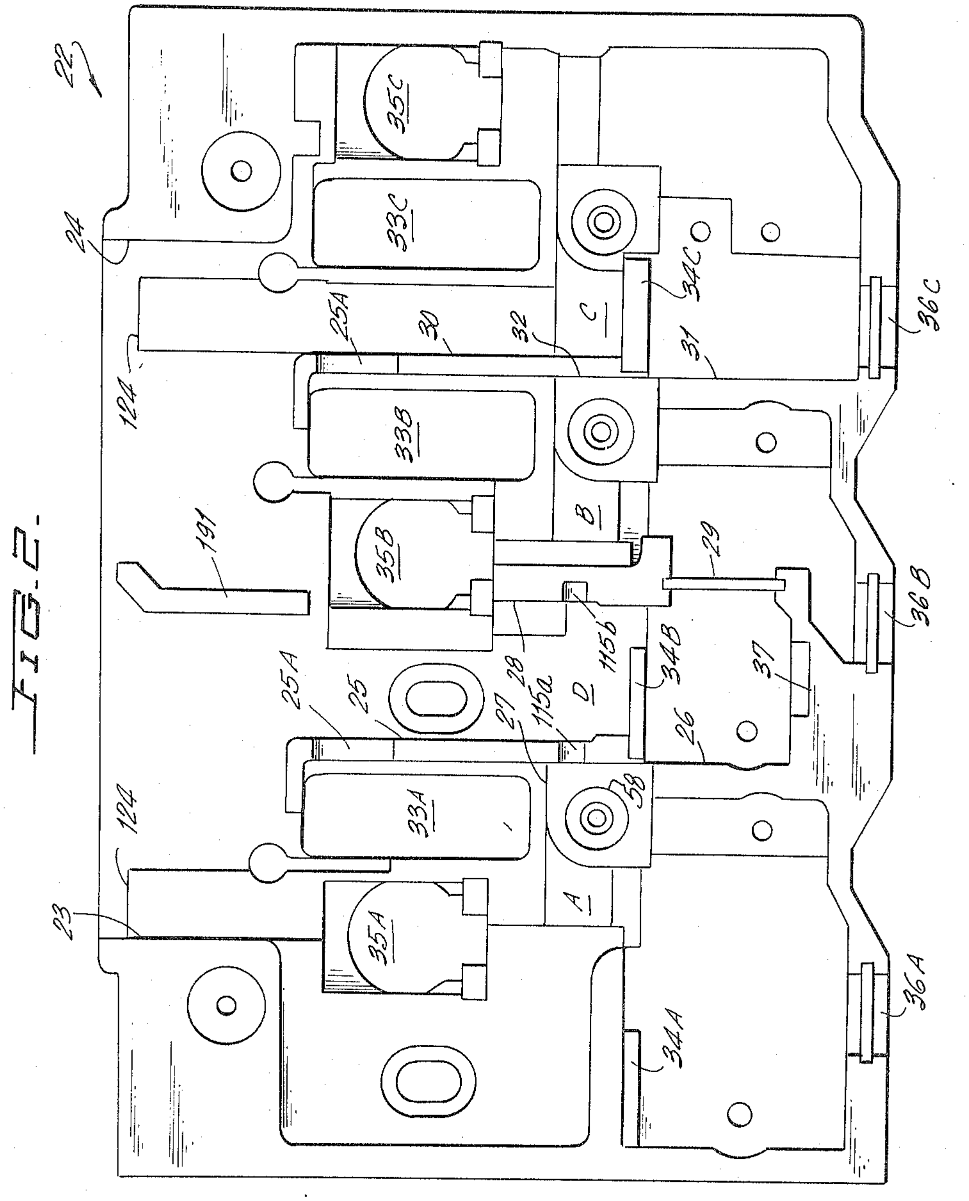
FIGURE 2 is an enlarged front elevation of the housing with the cover removed.
Figures 3, 3A, 3B, 3C, 3D:
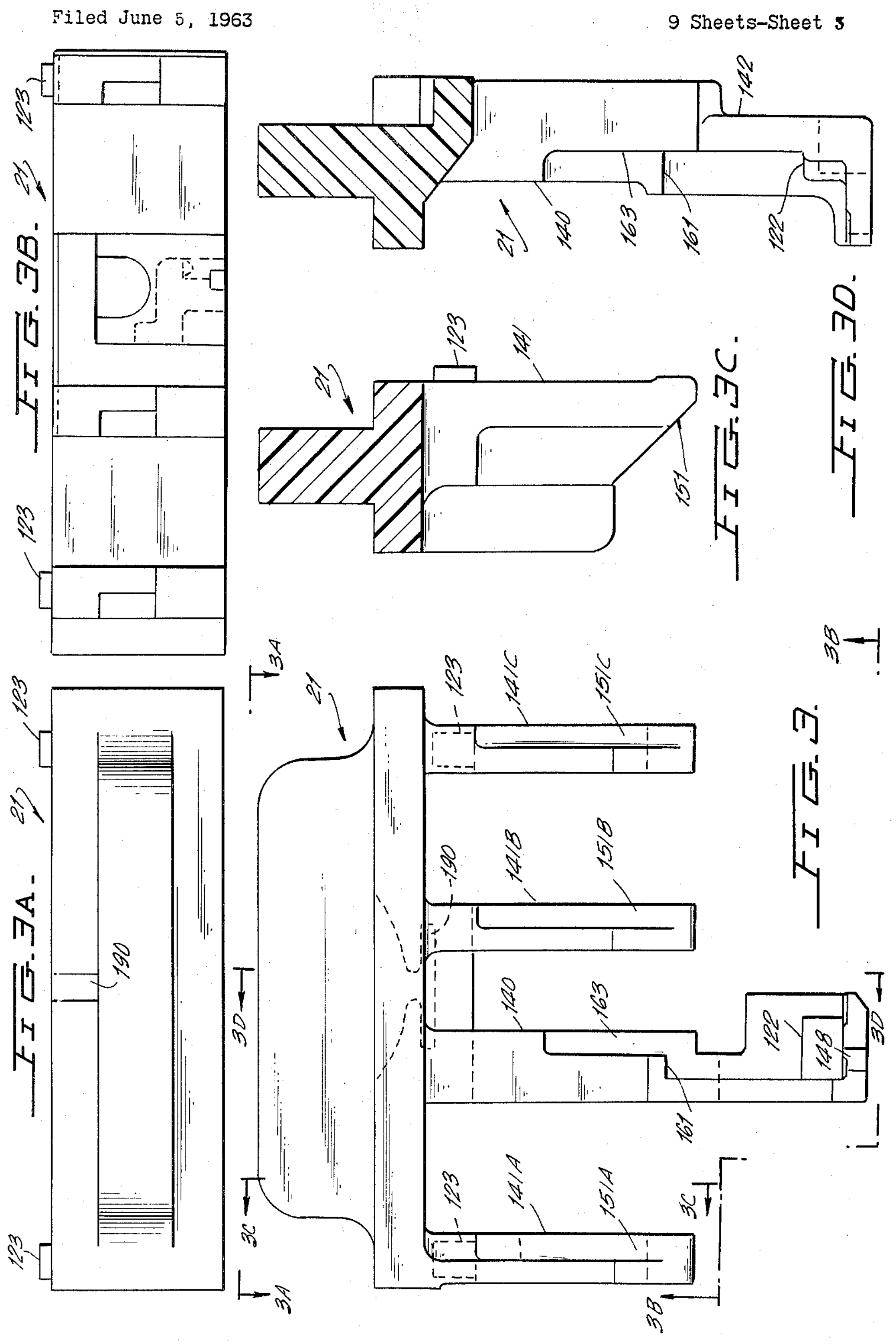
FIGURE 3 is a front elevation of the operating handle.
FIGURE 3A is a plan view of the operating handle looking in the direction of arrows 3A—3A of FIGURE 3.
FIGURE 3B is a bottom view of the operating handle looking in the direction of arrows 3B—3B of FIGURE 3.
FIGURE 3C is a cross-section taken through line 3C—3C of FIGURE 3 looking in the direction of arrows 3C—3C.
FIGURE 3D is a cross-section taken through line 3D—3D.

Now referring to the figures. Circuit breaker 20 is a three phase unit having manual operating handle 21 to bring about simultaneous opening and closing of the contacts of all three phases. Handle 21 is mounted within insulated housing 22 between abutments 23, 24 thereof. As will hereinafter become apparent, handle 21 is mounted for straight line reciprocating motion. As most clearly seen in FIGURE 2, housing 22 is divided into four side-by-side elongated compartments extending generally in the direction of movement for handle 21. These compartments A, B, C and D are for the most part formed by integral housing partitions and posts. Partitions 25, 26 and post 27 separate compartments A and D. Partition 28 and removable barrier 29 separate chambers B and D while partitions 30, 31 and post 32 separate chambers B and C. Chambers A, B and C each contain the individual current carrying and automatic tripping elements for a single circuit breaker phase while chamber D houses the common operating elements for all three phases.

Housing 22 also includes trip element chambers 33A, 33B and 33C as well as line terminal apertures 34A, 34B, 34C and load terminal apertures 35A, 35B and 35C. Further, housing 22 contains venting apertures 36A, 36B, 36C and seat formation 37 to receive one end of handle return spring 38. The front of housing 22 is closed by metal cover 39 having hooks 40 for the mechanical mounting of circuit breaker 20 and an insulating liner sheet 41 interposed between cover 39 and housing 22. In a manner well-known to the art rivets secure cover 39 and liner 41 to housing 22. Other salient structural features of housing 22 will be referred to in their relationship to the other elements of circuit breaker 20.

Since the current carrying elements and automatic tripping elements for each of the phases are substantially identical only the elements of the single phase will be described. The current path through each phase extends from the portion of line terminal member 43 external of housing 22 to the portion thereof internal of housing 22 which carries stationary contact 44, movable contact 45, contact carrying arm 46, braid 47, bimetal bracket 48, bimetal 49, braid 50, load terminal 51 and barrel connector 52 mounted to the portion of load terminal 51 disposed externally of housing 22.

Figure 14A:
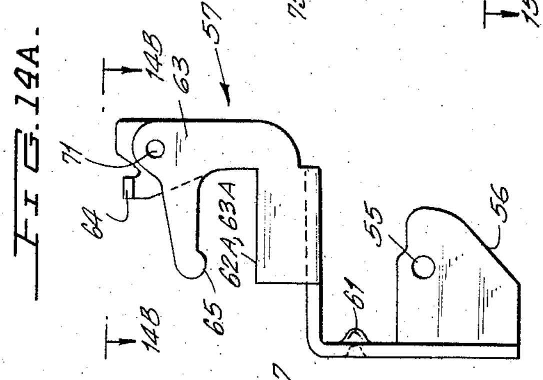
FIGURE 14A is a side elevation of the frame looking in the direction of arrows 14A—14A of FIGURE 14.
Figure 14B:
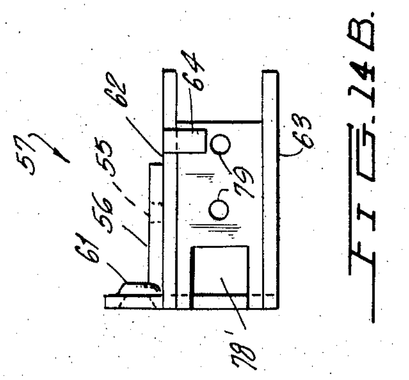
FIGURE 14B is a plan view of the frame looking in the direction of arrows 14B—14B of FIGURE 14A.
Figure 14:
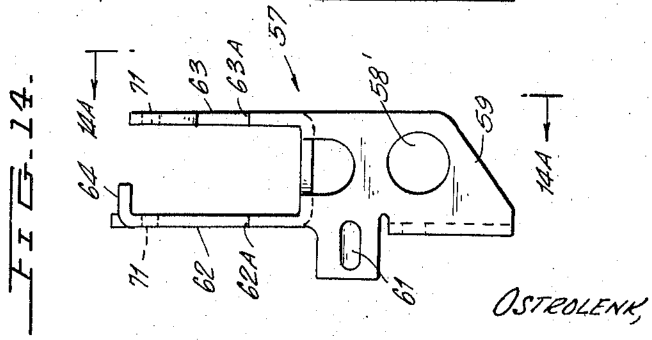
FIGURE 14 is a rear elevation of the automatic trip mechanism frame.

Contact arm 46 is provided with elongated aperture 53 for receiving pin 54 which extends through aperture 55 of bracket flange 56 to pivotally secure contact arm 46 to frame 57 with limited translational motion included so that elongated aperture 53 and cooperating pin 54 constitute a lost motion pivotal mounting for contact arm 46. Frame 57 (FIGURES 14–14B) is operatively positioned by embossment 58 of post 27 which extends into and is closely fitted to aperture 58′ in the downward extenstion 59 at the rear of frame 57. Frame 57 is provided with dimple 61 which locates one end of main spring 62 whose other end surrounds contact arm projection 63 to bias contact arm 46 to its circuit closing position when the upper end 76 thereof is fixed by the circuit breaker latch 75, as will be hereinafter explained. Frame 57 further includes upwardly extending spaced parallel walls 62, 63 formed with magnet pole faces 62A and 63A, respectively. Wall 62 is provided with inturned lug 64 while wall 63 is provided with blocking nose formation 65 for reasons to be hereinafter explained.

Figure 4:
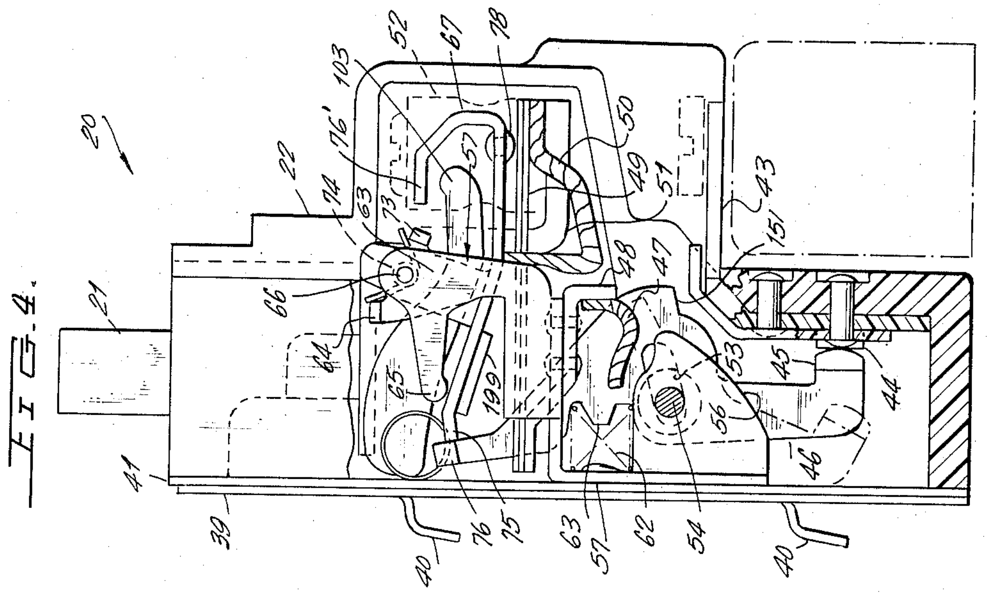
FIGURE 4 is a side elevation showing the elements of one phase in the ON position.
Figures 13, 13A, 13B, 13C, 13D, 13E:
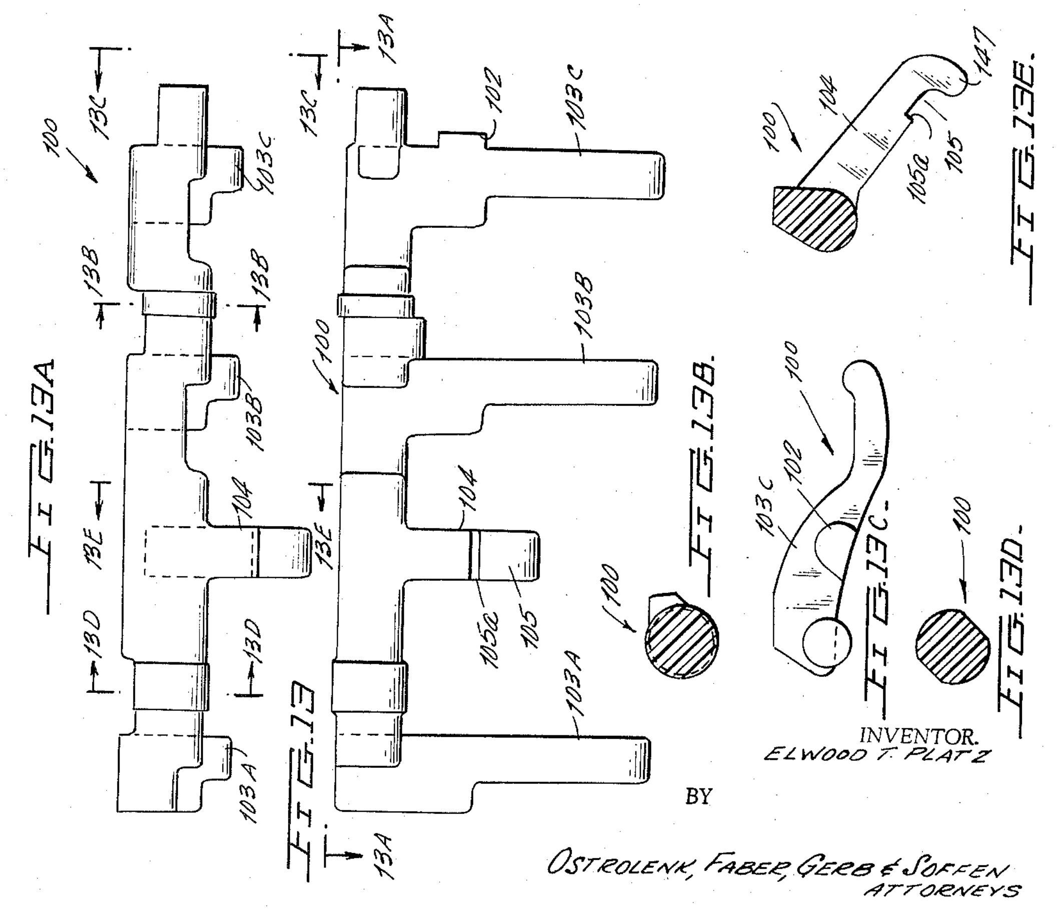
FIGURE 13 is a plan view of the tripper bar.
FIGURE 13A is an elevation of the tripper bar looking in the direction of arrows 13A—13A of FIGURE 13.
FIGURE 13B is a cross-section taken through line 13B—13B of FIGURE 13A looking in the direction of arrows 13B—13B.
FIGURE 13C is a side view of the tripper bar looking in the direction of arrows 13C—13C of FIGURE 13A.
FIGURE 13D is a cross-section taken through line 13D—13D of FIGURE 13A looking in the direction of arrows 13D—13D.
FIGURE 13E is a cross-section taken through line 13E—13E of FIGURE 13A looking in the direction of arrows 13E—13E.
Figure 15A:
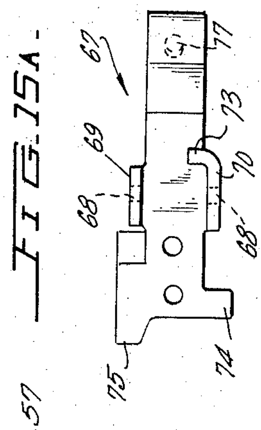
FIGURE 15A is a plan view of the tripper looking in the direction of arrows 15A—15A of FIGURE 15.
Figure 15:
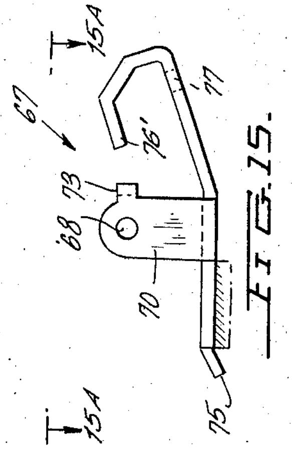
FIGURE 15 is a side elevation of a tripper.

Pivotally mounted to pin 66 and positioned between frame walls 62, 63 is tripper 67 (FIGURES 15 and 15A). Pin 66 extends through aligned apertures 68 in the upturned arms 69, 70 of tripper 67 and aligned apertures 71 in walls 62, 63 of frame 57. Arm 70 is provided with inturned lug 73 which supports one end of torsion spring 74 spiraled about pin 66. The other end of spring 74 bears against frame lug 64 thereby biasing tripper 67 in a clockwise direction with respect to FIGURE 4 about pin 66 as a center. Motion in this direction is limited through the engagement of tripper extension 74 with frame nose 65.

Tripper 67 is provided at its rear end with latching tip 76 which is positioned to engage the inturned formation 75 at the upper end of contact arm 46. The forward end of tripper 67 is turned upwardly and terminates in tripping formation 76′. Aperture 77 at the forward portion of tripper 67 is provided to receive insulating button 78 which is interposed between bimetal 49 and tripper 67 near the free end of bimetal 49. Cut-out 78′ at the rear end of frame 57 is provided for the passage of bimetal mounting bracket 48 with apertures 79 in frame 57 being provided for the passage of fastening means which secures bracket 48 to frame 57. Thus, it is seen that bimetal 49 forms a single energizing turn for the magnet portion of frame 57.

As most clearly seen in FIGURES 1, 2, 4 and 13 through 13E, common tripper bar 100 is an elongated member mounted for pivotal movement in the bearings, cut-outs 25A, 30A of housing partitions 25 and 30, respectively. Torsion spring 101 mounted at the right end of tripper bar 100, when viewed in FIGURE 1, bears against tripper bar lug 102 and a portion of housing 22 to bias tripper bar 100 in a clockwise direction with respect to FIGURE 4. Bar 100 is provided with trip extensions 103A, 103B and 103C which extend beneath the inturned tip 76′ of tripper 67. In a manner to be hereinafter explained, when tripper bar 100 is rotated counterclockwise with respect to FIGURE 4 tip 103 engages tripper end 76′ causing tripper 67 to rotate counterclockwise with respect to FIGURE 4 to move its latching tip 75 downward so that contact arm end 76 is released and main spring 62 is effective to separate cooperating contacts 44, 45.

Figure 5:
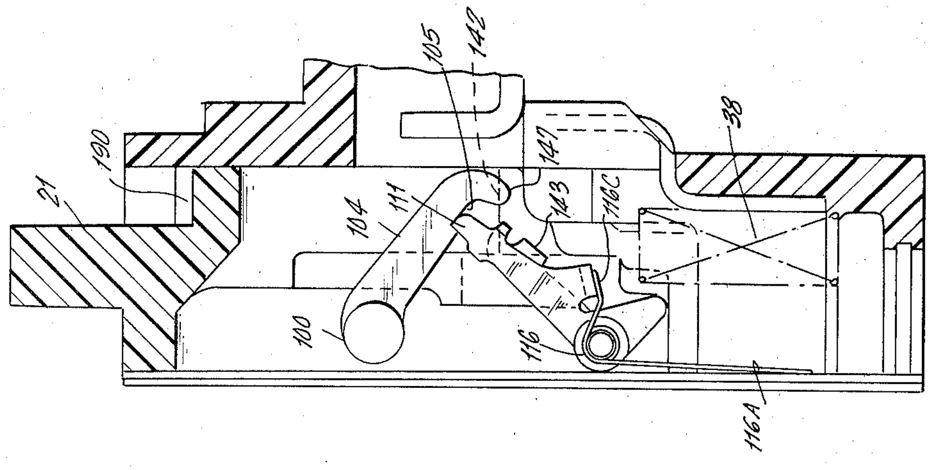
FIGURE 5 shows the positions of the common operating elements when the phase elements are in the ON position of FIGURE 4.
Figure 17A:
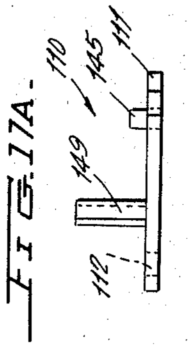
FIGURE 17A is an elevation of the lever element looking in the direction of arrows 17A—17A of FIGURE 17.
Figure 17:
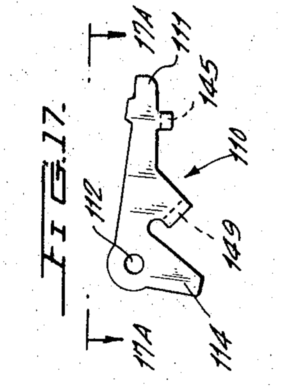
FIGURE 17 is a side elevation of a lever element.

Tripper bar 100 is also provided with extension 104 which is entered into mechanism chamber D. Extension 104 is provided with notch 105 which receives the free end 111 of lever 110 (FIGURES 5, 17 and 17A). Lever 110 is constructed of sheet material and is pivoted about a center defined by pin 115 which extends through lever aperture 112 at the end of the lever remote from tip 111. Torsion spring 116 biases lever 110 counterclockwise with respect to FIGURE 5. With lever tip 111 positioned within tripper bar notch 105 and resting against notch surface 105A tripper bar 100 is in a so-called reset position, as will hereinafter become apparent. With lever 110 positioned as in FIGURE 5, lever nose 114 is positioned to engage handle leg 122 to limit upward movement of handle 21 to an intermediate position where it projects less than with handle stops 123 engaging internal housing surface 124.

Spring 116 is mounted to pin 115 which extends across compartment D and is journaled in bearing formations 115A, 115B. Spring 116 is a compound torsion unit which not only biases lever 110 in a counterclockwise direction with respect to FIGURE 5 but in addition biases ratchet 125 (FIGURES 1, 10, 16 and 16A) in a clockwise direction about pin 115 as a center. Lever 110 is force fitted to pin 115 while aperture 126 at one end of lever 125 provides a loose fit so that lever 125 is pivotable relative to pin 115.

Figure 7:
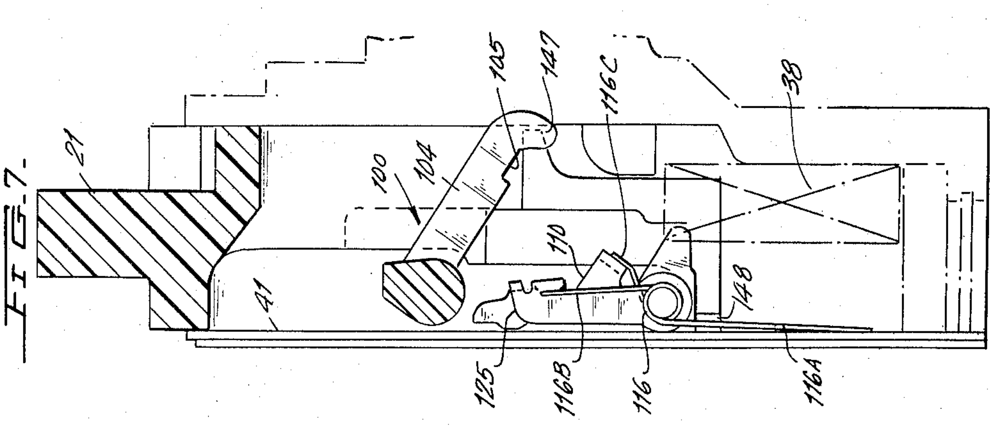
FIGURE 7 is a view similar to FIGURE 5 with the elements in the OFF position and the manual operating handle released.
Figure 6:
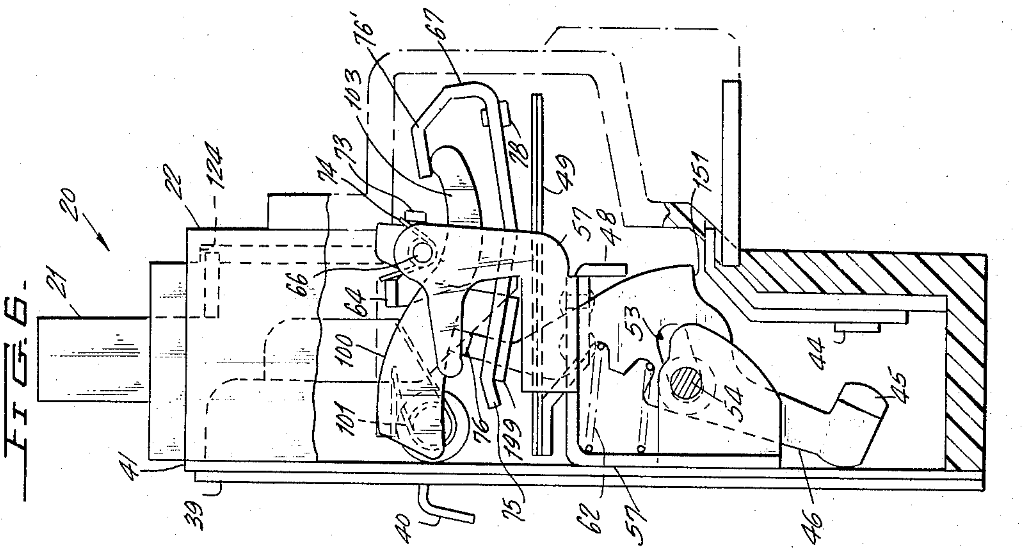
FIGURE 6 is a view similar to FIGURE 4 with the phase elements in the OFF position and the manual operating handle released.
Figure 8:
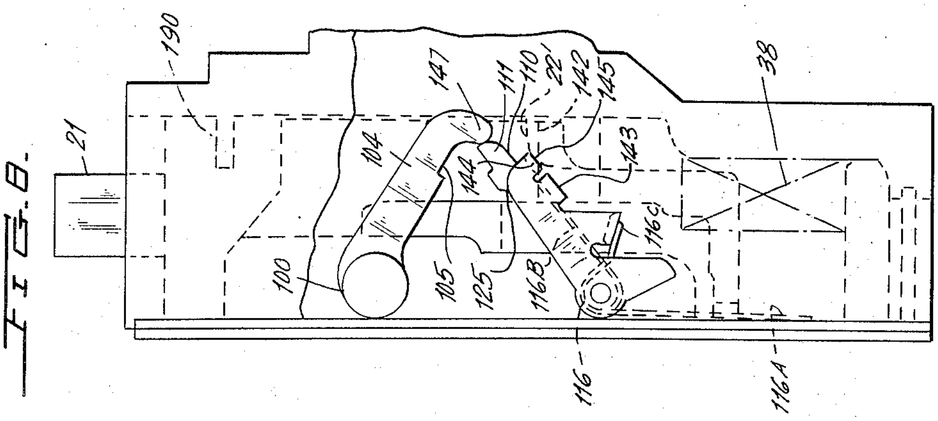
FIGURE 8 is a view similar to FIGURES 5 and 7 with the manual operating handle depressed in turning the circuit breaker OFF.
Figure 12:
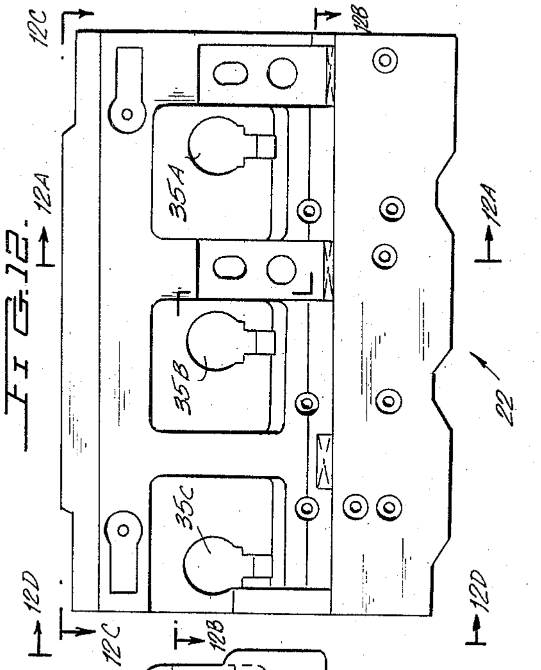
FIGURE 12 is a front view of the housing of the circuit breaker.
Figure 12B:
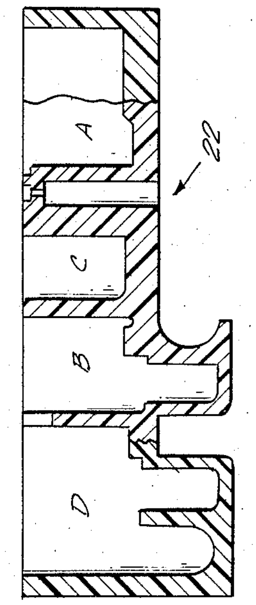
FIGURE 12B is a cross-section taken through line 12B—12B of FIGURE 12 looking in the direction of arrows 12B—12B.
Figure 12D:
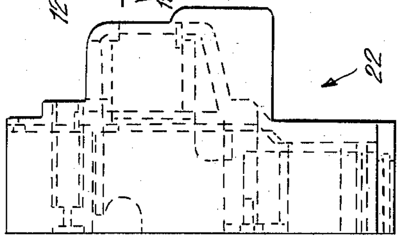
FIGURE 12D is a side elevation of the housing looking in the direction of arrows 12D—12D of FIGURE 12.
Figure 12A:
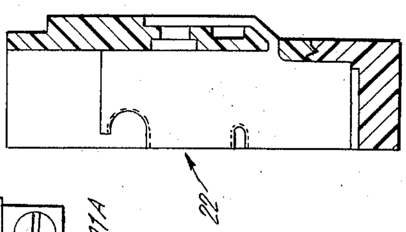
FIGURE 12A is a cross-section taken through line 12A—12A of FIGURE 12 looking in the direction of arrows 12A—12A.
Figure 12C:
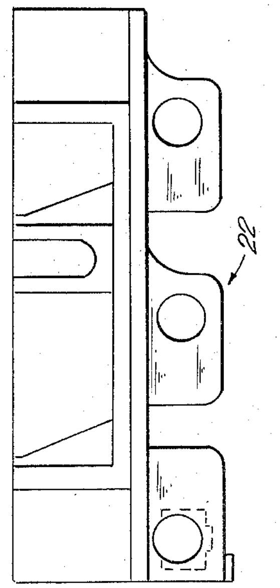
FIGURE 12C is a plan view of the housing looking in the direction of arrows 12C—12C of FIGURE 12.

Handle 21 is provided with axial extension 140 which is disposed within mechanism compartment D and is also provided with axial extensions 141A, 141B, and 141C which are disposed within housing compartments A, B and C, respectively. With circuit breaker 20 in the ON position of FIGURE 4, upon downward movement of handle 21 to the position of FIGURE 8 step 142 of handle extension 140 engages lug 143 of ratchet 125 rotating ratchet 125 in a clockwise direction. This downward movement is limited by case lug 22′ which is engaged by lever lug 145 thereby preventing continued movement of handle 21 from closing contacts 44, 45. The end 144 of ratchet 125 remote from pin 115 engages lever lug 145 thereby rotating lever 110 clockwise. In rotating clockwise, the tip 111 of lever 110 engages nose 147 of trip bar extension 104 causing trip bar 100 to pivot counterclockwise. This in turn causes the free end of trip bar extension 103 to engage tripper end so that tripper 67 is rotated counterclockwise about pin 66 moving the other end 75 of tripper 67 below latching tip 76 of contact arm 46. With tip 76 unlatched, spring 62 drives contact arm 46 in a clockwise direction about pivot 54 to separate contact 45 from contact 44. Upon the release of handle 21, the portion of spring 116 urging levers 110 in a counterclockwise direction overcomes the force of the spring portion urging ratchet 125 in a clockwise direction with both lever 110 and ratchet 125 moving in a counterclockwise direction. This movement is limited through the engagement of lever 110 with cover liner 41 (FIGURE 7). Handle extension 140 is provided with notch 148 which provides a clearance path for the end 116A of spring 116 which bears against cover liner 41. The other end 116B of spring 116 abuts lug 143 of lever 125. With circuit breaker 20 in the OFF position latching tip 76 of contact arm 46 is in engagement with tripper bar extension 103 to maintain tripper bar 100 in a position counterclockwise with respect to the reset position of FIGURE 9 and the ON position of FIGURE 4.

Tripping due to moderate overcurrents is effective to automatically trip breaker 20 through the upward bending at the free end of bimetal 49 which engages button 78 mounted to tripper 67. This causes tripper 67 to rotate in a counterclockwise direction releasing latching tip 75 from latch end 76 of contact arm 46 in the phase where the overload condition exists. Latched end 76′ of the overloaded phase engages its associated tripper bar extension 103 as contact arm 46 moves to the OFF position. This rotates all three trip bar extensions 103 in a counterclockwise direction into engagement with tripper end thereby rotating the trippers of the other phases in a counterclockwise direction so as to release their latching tips 75 from the latch ends 76 of their associated contact arms 46 thereby enabling springs 62 of the other phases to separate the cooperating contacts thereof.

A similar operation takes place upon the occurrence of higher magnitude overcurrents. Under these conditions current flowing through bimetal 49 energizes the magnet formed by frame 57. The flux generated causes armature 199, secured to the underside of tripper just forward of latching tip 75, to be attracted to pole faces 62A, 62A thereby rotating tripper counterclockwise releasing the contact arm of the overloaded phase. This contact arm pivots trip bar 100 and by so doing the trippers of the other phases are operated to release the contact arms of these other phases.

If thermal or magnetic tripping should occur during the closing stroke of handle 21 it is apparent that contact arms ends 76 cannot be latched so that main springs 62 will be ineffective to bring about closing of circuit breaker 20.

Figure 10:
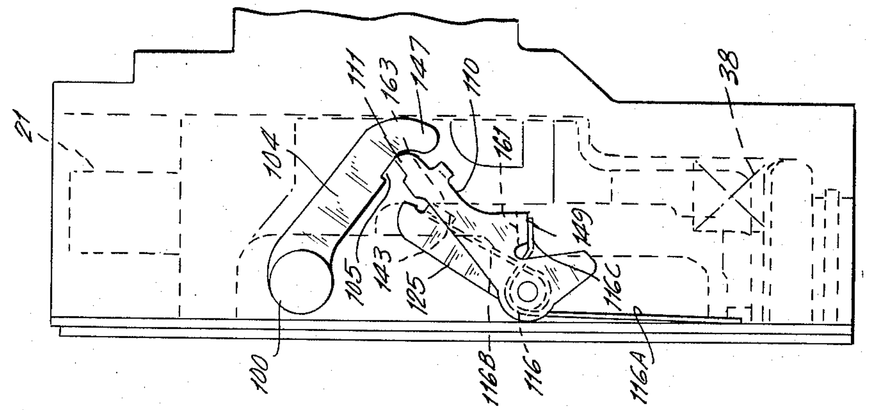
FIGURE 10 is a view similar to FIGURES 5, 7 and 8 with the common operating elements in positions corresponding to those occupied by the elements illustrated in FIGURE 9.
Figure 9:
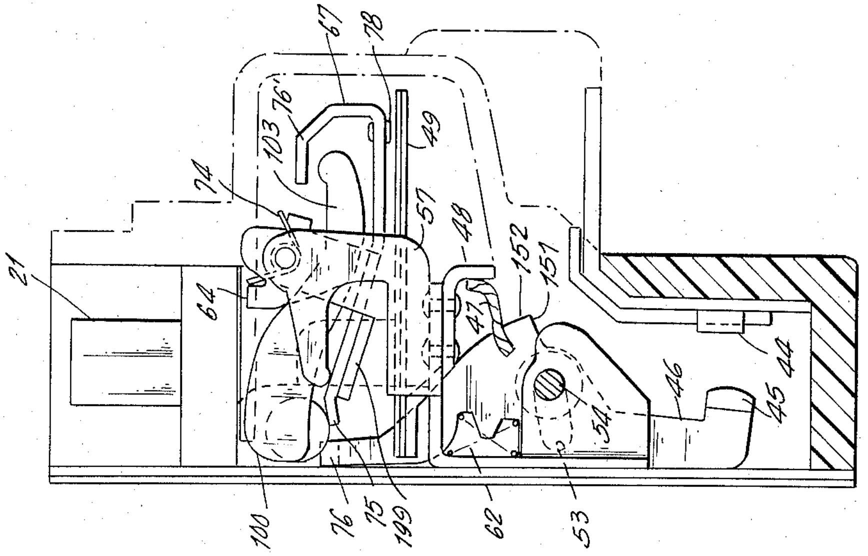

Operation of circuit breaker 20 to the ON position is effected by depressing handle 21 to the position shown in FIGURES 9 and 10. This brings cam surfaces 151 of the respective handle extensions 141A, 141B and 141C into engagement with their associated contact arms 46 at surfaces 152 driving contact arm 46 its left most position as seen in FIGURE 9 against the forces of springs 62. Contact arm mounting pin 54 is now disposed in the right-hand end of slot 53 with respect to FIGURE 9. Upon release of handle 21 cam 151 moves free of contact arm surface 152 so that main spring 62 is effective to first drive latch end 76 against latch tip 75 and thereafter rotate contact arm 46 counterclockwise with respect to pivot 54 so that movable contact 45 engages stationary contact 44.

As handle 21 is moved inward to the position of FIGURE 9, formation 161 of handle extension 140 engages lever lug 149 rotating lever 110 in a clockwise direction to a position such that the lever tip 111 is below but rotationally in line with the notch 105 in the arm 104 of the common trip bar as shown in FIGURE 10. Ratchet 125, being biased to a clockwise direction by the end 116B of the spring 116 moves with lever 110 until a point where ratchet lug 143 engages surface 163 of handle extension 140. As handle 21 is released from its position of FIGURE 10 tripper bar 100 moves clockwise and lever 110 moves counterclockwise until these elements assume their positions of FIGURE 5. At this time handle extension surface 163 no longer supports ratchet 125 so that it now moves clockwise into engagement with lever 110.

Figure 11:
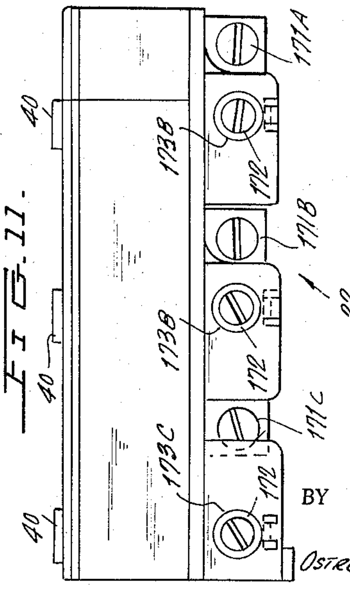
FIGURE 11 is a plan view of the circuit breaker.
Figure 16A:
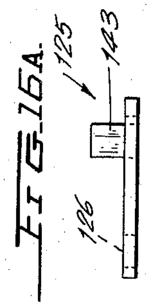
FIGURE 16A is a plan view of a latch element looking in the direction of arrows 16A—16A of FIGURE 16.
Figure 16:
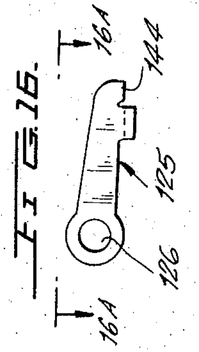
FIGURE 16 is a side elevation of a latch element.

As seen in FIGURE 11, housing 22 is so constructed that line terminal connecting screws 171 are accessible from the top of circuit breaker 20 as are clamping screws 172 of wire grips 173 mounted to each of the circuit breaker load terminals. It is noted that the terminals for all three phases emerge from the housing wall which is opposite the housing wall having mounted hooks 40. In addition housing 22 is provided with guide slot 191 and handle 21 is provided with recess 190 to receive and guide an ON-OFF visual indicator (not shown) as in the prior art.

Figure 19B:
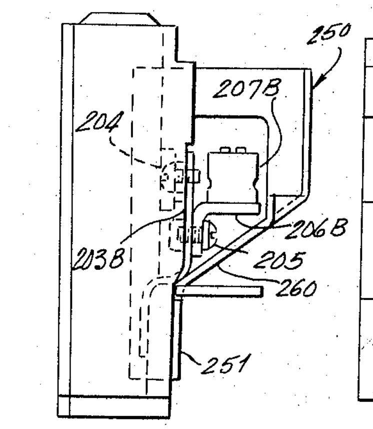
FIGURES 19A and 19B are a front and side elevation, respectively, of a delta breaker having the insulator of FIGURE 18 mounted thereto.
Figure 19A:
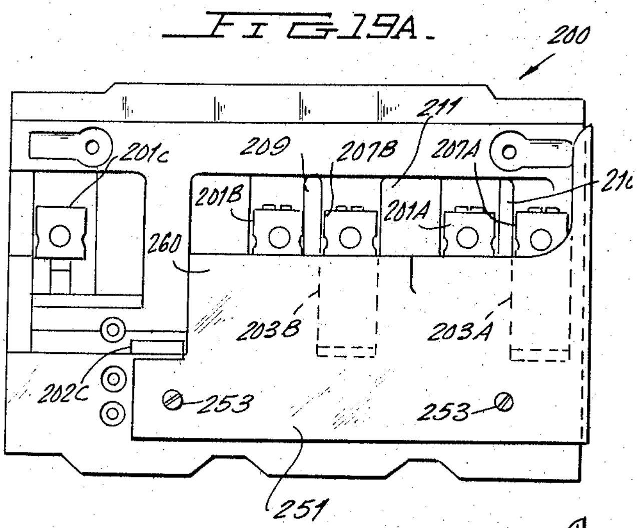
Figure 18C:
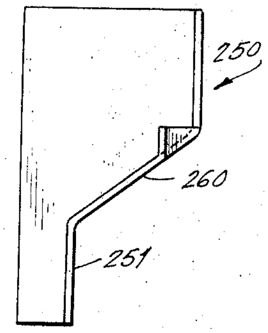
FIGURES 18A through 18D are a perspective, a front elevation, a side elevation and a plan view, respectively, of an insulator used when the circuit breaker of FIGURE 1 is converted to a delta breaker.
Figure 18B:
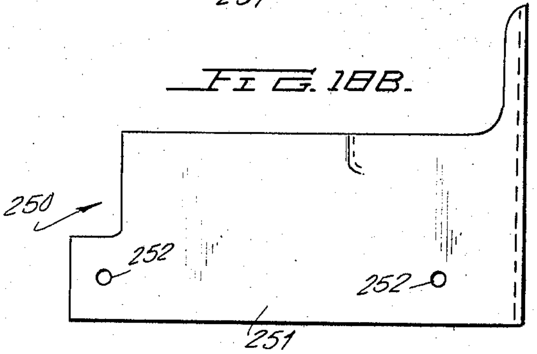
Figures 18A, 18D:
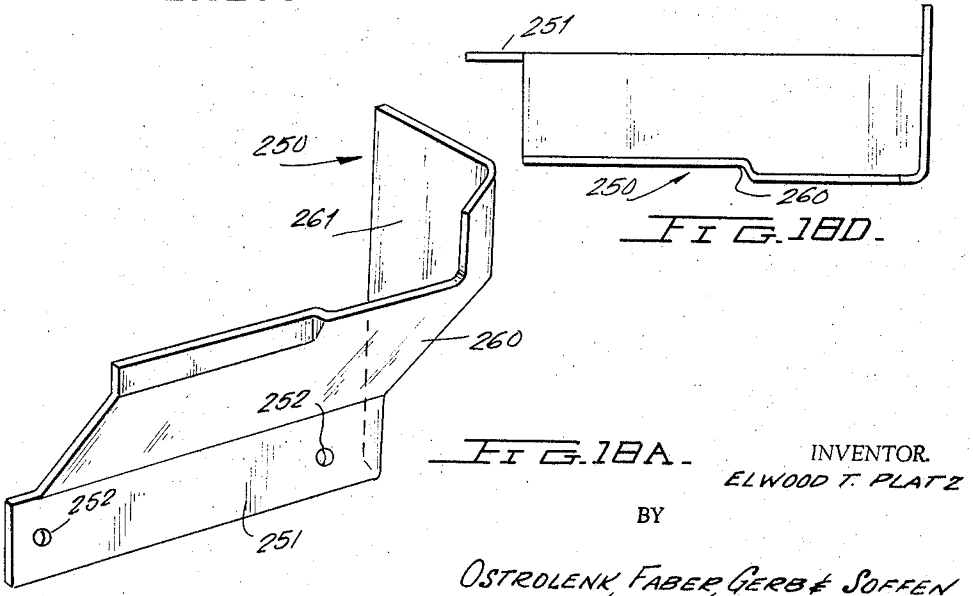

FIGURES 19A and 19B illustrate the circuit breaker previously described after its conversion for a special application wherein it is known as a delta breaker. More specifically, this special application comes about when it is desired to mount the three-phase breaker in a two-wire panelboard of the type described in the now abandoned Farnsworth et al. application Serial No. 806,959, filed April 16, 1959. For such an application the panelboard is energized from two phases of a three-phase transformer. One of the circuit breaker line terminals is secured directly to one of the panelboard conductors, a second line terminal is connected by means of a jumper to the other panelboard conductor, while the third line terminal is connected by means of a jumper directly to the phase of the transformer which is not used to energize the panelboard.

Delta circuit breaker 200 is provided with the same operating mechanism and the same internal conducting elements as previously described. In addition, delta breaker 200 is provided with load terminals 201A, 201B and 201C as previously described. Line terminal 202C, of conventional construction, extends transverse to the rear of the breaker housing and is adapted to be electrically and mechanically secured directly to a panelboard conductor. However, line terminals 203A and 203B, though identical to one another, differ in construction and position from line terminal 202C. More particularly the portion of line terminal 203B which is external to the breaker housing extends parallel to the rear wall thereof and is drawn thereagainst by screw 204. Screw 205 secures one leg of bracket 206B to the portion of terminal 203B external of the breaker housing. The other leg of bracket 206B carries wire grip 207B and positions the latter so that it is substantially in line with load terminals 201A, 201B and 201C.

Rearwardly extending housing barrier 209 is interposed between line terminal connector 207B and load terminal connector 201B and rearwardly extending housing barrier 210 is interposed between line terminal connector 207A and load terminal connector 201A. Similarly, barrier 211 is interposed between line terminal connector 207B and load terminal connector 201A.

In the two-wire panelboard of the aforesaid copending application 806,959, the conductor to which line terminal 202C is secured runs the full length of delta circuit breaker 200 and is exposed for this entire length. Even though line terminals 203A and 203B are upwardly bent so as not to engage this panelboard conductor, terminals 203A and 203B are in such close proximity to this panelboard conductor and at different potentials that special insulator 250 is required.

Insulator 250 (FIGURES 18A–18D) is interposed between line terminals 203A, 203B and the panelboard conductor to which line terminal 202C is connected. Insulator 250 is a thin walled member having a front portion 251 which extends below line terminals 203A, 203B and 202C. Portion 251 is provided with clearance apertures 252 through which screws 253 extend. Screws 253 secure insulator 250 to delta breaker 200 with insulator portion 251 lying against the rear of the housing. The upper edge of insulator portion 251, at that part thereof which is to the right of line terminal 202C in FIGURE 19A, is provided with an upwardly and rearwardly sloping portion 260.

Sloping insulator portion 260 extends below terminals 201A, 201B, 207A and 207B so as to be interposed between these terminals and the panelboard conductor to which line terminal 202C is connected. Insulator 250 is provided with end wall 261 which extends forwardly from the right ends of portions 251 and 260 so as to lend rigidity to the structure.

As previously noted, line terminal 202C is connected directly to one of the panelboard conductors. This conductor is on the same side of the panelboard mounting rib as delta breaker 200. A jumper (not shown) extends from line terminal connector 201A to the panelboard conductor on the other side of the mounting rib while another jumper extends from line terminal connector 207B to the terminal of the three-phase transformer which is not used to energize the panelboard.

Thus, this invention provides a novel construction for a three-phase circuit breaker in which the operating handle is located at the top of the circuit breaker housing and all of the line and load terminals extend from one of the sides of the housing. The operating mechanism is such that trip free operation is achieved with the mechanism utilizing an operating handle by which successive operations thereof in the same direction open and close all phases of the circuit breaker simultaneously.

It is noted that in the foregoing description the housing wall through which the handle extends has been referred to as the top and the housing wall which carries the line and load terminals has been referred to as the back. This has been done so with the purpose of avoiding confusion when viewing the figures as presented. Of course it is realized that in the unusual application circuit breakers of the type described will be mounted within a panelboard which is secured to a vertical surface. Under these circumstances the circuit breaker housing surface through which the operating handle extends will be the front of the circuit breaker.

It is also noted that in the claims which follow the term "associated" has been utilized when referring to elements of the same phase rather than to an element which is common to all phases. This has been done for the sake of brevity and it is believed that clarity has not been sacrificed.

Although preferred embodiments of the novel invention have been described, many variations and modifications will now be apparent to those skilled in the art, therefore it is preferred to be limited not by the specific disclosure herein but only by the appended claims.

The embodiments of the invention in which an exclusive privilege or property is claimed as defined as follows:

1. A multiphase circuit breaker comprising a housing, a contact operating mechanism disposed entirely within said housing, a handle extending through an aperture in the top surface of said housing for actuating said mechanism; an independent set of current carrying elements for each phase of said circuit breaker, each of said sets of elements including a line terminal, a load terminal, and a pair of cooperating contacts connected to said mechanism and operable into and out of engagement by said mechanism upon actuation of said mechanism by said handle; said line and said load terminals of all phases extending through apertures in the back surface of said housing, mechanical mounting means extending from another surface of said housing for securing said circuit breaker in a panelboard.

2. The circuit breaker of claim 1 in which the housing is provided with internal formations defining an individual compartment for each of said sets of current carrying elements and an additional compartment for certain elements of said mechanism, said mechanism including a common trip bar disposed entirely within said housing and extending through each of said compartments for simultaneously opening all phases of said circuit breaker.

3. The circuit breaker of claim 2 in which each of the compartments are elongated and are positioned side by side with said additional compartment positioned between a first and a second of said individual compartments, said handle being mounted for reciprocating motion along a path generally parallel to the longitudinal axes of said compartments.

4. The circuit breaker of claim 3 in which each of said sets of elements includes an arm, means defining pivotal mountings for said arms guiding movement of said arms in planes generally at right angles to said back surface of said housing, one of said cooperating contacts mounted at one end of said arm, said mechanism including an individual tripper for each phase of said circuit breaker, means biasing each of said trippers to latching positions wherein said trippers are engageable with said arms at the other ends thereof, an individual main spring in operative engagement with each of said arms, each of said springs being positioned to operate said cooperating contacts of its phase into engagement when said other end of the arm is engaged and maintained in latched positions by the tripper and to operate said cooperating contacts of its phase out of engagement when said tripper releases said arm.

5. The circuit breaker of claim 4 in which the trip bar includes extension individual to each of the circuit breaker phases for simultaneously engaging and operating all of said trippers away from said latching positions to release their associated arms.

6. The circuit breaker of claim 5 including an individual fault current responsive trip means for each phase of said circuit breaker disposed in the individual compartments for the respective phases, said trip means upon being actuated operating the tripper of its associated phase to release the arm of its associated phase with this arm when released engaging the trip bar extension of its associated phase to operate said trip bar and thereby move the extension to operate the other trippers of all other phases to release their associated arms.

7. The circuit breaker of claim 6 in which the handle includes cam formations for operating said arms into position for engagement by said trippers, with said contacts disengaged movement of said handle inwardly of said housing bringing said cam formations into operative engagement with said arms for operation thereof into position for engagement by said trippers.

8. The circuit breaker of claim 7 in which the handle is provided with a projection extending into said additional compartment and engageable with the certain elements of said mechanism for moving said certain elements to operate said trip bar between a trip position and a reset position, said trippers being operated by said bar to release said arms when said bar is in said trip position.

9. The circuit breaker of claim 8 in which the trip bar is an elongated member mounted for pivotal movement, said certain elements including a lever and a ratchet both mounted for pivotal movement about axis means extending parallel to the pivotal axis for said trip bar, said trip bar having a projection engageable with said lever to maintain said lever in a first position when said trip bar is in said reset position, said lever being operable to a second position by said projection of said handle acting through said ratchet, said lever when in said second position operating said trip bar to said trip position.

10. The circuit breaker of claim 9 in which there is a return spring biasing said handle toward an extreme position outwardly of said housing, said lever having a stop which engages and limits movement of said handle to an intermediate outward position when said lever is in said first position.

11. The circuit breaker of claim 10 in which the lever is operable to a third position wherein said stop is positioned to permit movement of said handle to said extreme position, said first position being intermediate said second position and said third position.

12. The circuit breaker of claim 11 in which there is a biasing means urging said lever to said third position and urging said ratchet toward said lever.

13. A multiphase circuit breaker comprising a housing, a contact operating mechanism disposed entirely within said housing, a handle extending through an aperture in the top surface of said housing for actuating said mechanism; an independent set of current carrying elements for each phase of said circuit breaker, each of said sets of elements including a line terminal, a load terminal, and a pair of cooperating contacts connected to said mechanism and operable into and out of engagement by said mechanism upon actuation of said mechanism by said handle; said line and said load terminals of all phases extending through apertures in the back surface of said housing, mechanical mounting means extending from another surface of said housing for securing said circuit breaker in a panelboard; at least one of said line terminals being positioned more remote from said top surface than all of said load terminals.

14. A multiphase circuit breaker comprising a housing, a contact operating mechanism disposed entirely within said housing, a handle extending through an aperture in the top surface of said housing for actuating said mechanism; an independent set of current carrying elements for each phase of said circuit breaker, each of said sets of elements including a line terminal, a load terminal, and a pair of cooperating contacts connected to said mechanism and operable into and out of engagement by said mechanism upon actuation of said mechanism by said handle; said line and said load terminals of all phases extending through apertures in the back surface of said housing, mechanical mounting means extending from another surface of said housing for securing said circuit breaker in a panelboard; said housing being provided with internal formations defining an individual compartment for each of said sets of elements and an additional compartment for certain elements of said mechanism, said additional compartment positioned between a first and a second of said individual compartments, said mechanism including a common trip bar extending through each of said compartments for simultaneously opening all phases of said circuit breaker; an individual main spring in operative engagement with a movable one of said cooperating contacts of each of said phases for opening and closing the cooperating contacts of each phase; said handle being provided with a projection extending into said additional compartment and engageable with the certain elements of said mechanism for moving said certain elements to operate said trip bar between a trip position and a reset position; said cooperating contacts being operated out of engagement when said trip bar is in said trip position.

15. The circuit breaker of claim 14 in which the trip bar is an elongated member mounted for pivotal movement, said certain elements including a lever and a ratchet mounted for pivotal movement about an axis parallel to the pivotal axis for said trip bar, said trip bar having a projection engageable with said lever to maintain said lever in a first position when said trip bar is in said reset position, said lever being operable to a second position by said projection of said handle acting through said ratchet, said lever when in said second position operating said trip bar to said trip position.

16. The circuit breaker of claim 15 in which there is a return spring biasing said handle toward an extreme position outwardly of said housing, said lever having a stop which engages and limits movement of said handle to an intermediate outward position when said lever is in said first position.

17. The circiut breaker of claim 16 in which the lever is operable to a third position wherein said stop is positioned to permit movement of said handle to said extreme position, said first position being intermediate said second position and said third position.

18. The circuit breaker of claim 17 in which there is a biasing means urging said lever to said third position and urging said ratchet toward said lever.

19. The circuit breaker of claim 3 in which said handle is operatively engageable with said mechanism in such manner that with said contacts disengaged manual operation of said handle in a first direction actuates said mechanism to operate said contacts into engagement and with said contacts engaged manual operation of said handle in said first direction actuates said mechanism to operate said contacts out of engagement.

References Cited by the Examiner

UNITED STATES PATENTS

| | | | |
|---|---|---|---|
| 2,503,409 | 4/1950 | Platz et al. | 200—116 |
| 2,542,533 | 2/1951 | Johansson | 200—18 X |
| 2,967,917 | 1/1961 | Cole | 200—50 |
| 3,101,399 | 8/1963 | Christensen | 200—168 |
| 3,105,132 | 9/1963 | Jencks | 200—168 |

ROBERT S. MACON, *Acting Primary Examiner.*

BERNARD A. GILHEANY, *Examiner.*

M. GINSBURG, *Assistant Examiner.*